US005599595A

United States Patent [19]

McGinley et al.

[11] Patent Number: 5,599,595
[45] Date of Patent: Feb. 4, 1997

[54] PRINTED PLASTIC CIRCUITS AND CONTACTS AND METHOD FOR MAKING SAME

[75] Inventors: William J. McGinley, Barrington Hills; John R. Cannon, Wayne; William J. Green, Lisle; Richard P. Zanardo, Matteson, all of Ill.

[73] Assignee: Methode Electronics, Inc., Chicago, Ill.

[21] Appl. No.: 468,235

[22] Filed: Jun. 6, 1995

Related U.S. Application Data

[62] Division of Ser. No. 294,347, Aug. 23, 1994, abandoned, which is a division of Ser. No. 164,150, Dec. 9, 1993, abandoned.

[51] Int. Cl.[6] .................................................. B52B 9/00
[52] U.S. Cl. .......................... 428/33; 428/901; 439/59; 439/75; 439/119; 439/120; 439/638; 439/931; 439/404
[58] Field of Search .................... 439/76, 638, 931.1, 439/931, 404, 59, 75, 119, 120; 428/33, 901

[56] References Cited

U.S. PATENT DOCUMENTS

| | | | |
|---|---|---|---|
| 3,088,087 | 4/1963 | Colten | 439/50 |
| 3,341,806 | 9/1967 | Joachim | 439/76.1 |
| 4,811,165 | 3/1989 | Currier et al. | 361/386 |
| 4,838,799 | 6/1989 | Tonooka | 439/931 |
| 4,850,899 | 7/1989 | Maynard | 439/628 |
| 4,881,902 | 11/1989 | Papa et al. | 439/76.1 |
| 4,997,376 | 3/1991 | Buck et al. | 439/931.1 |
| 5,037,332 | 8/1991 | Wilson | 439/931 |
| 5,044,992 | 9/1991 | Dzwonczyk et al. | 439/608 |
| 5,147,209 | 9/1992 | Litwin et al. | 439/70 |
| 5,338,221 | 8/1994 | Bowen et al. | 439/405 |
| 5,376,403 | 12/1994 | Capote et al. | 427/96 |

FOREIGN PATENT DOCUMENTS

| | | |
|---|---|---|
| 0311232 | 4/1989 | European Pat. Off. . |
| 0396098 | 11/1990 | European Pat. Off. . |
| 0464643 | 1/1992 | European Pat. Off. . |
| 63014879 | 9/1993 | Japan . |
| 05283842 | 1/1994 | Japan . |
| 06112626 | 4/1994 | Japan . |

OTHER PUBLICATIONS

"Polyester, Thermoplastic Liquid Crystal Polymers", *Modern Plastics Encyclopedia*, Mid–October Issue 1991.

Primary Examiner—Patrick Ryan
Assistant Examiner—Cathy K. Lee
Attorney, Agent, or Firm—David L. Newman

[57] ABSTRACT

A conductive component for carrying electrical signals constructed from a molded polymer substrate and a conductive coating adhered to the substrate, the coating defining a continuous electrical pathway between at least two terminals. Preferably, molded plastic such as liquid crystal polymer is formed to make circuits having conductive ink adhered thereto in order to provide inexpensive and versatile printed circuit boards for carrying electrical traces and other components and to provide printed formed contacts. The conductive solderable inks can be adhered to the substrate, for example, via screen printing, brush, spraying, dipping, masking, vacuum plating or vacuum deposition with subsequent oven drying, reflowing in a vapor phase, post curing or plating.

13 Claims, 9 Drawing Sheets

PRINTED PLASTIC CIRCUITS AND CONTACTS AND METHOD FOR MAKING SAME

This is a division of application Ser. No. 08/294,347, filed Aug. 23, 1994, now abandoned, which is a division of application Ser. No. 08/164,150, filed Dec. 9, 1993, now abandoned.

BACKGROUND OF THE INVENTION

The present invention relates to printed plastic circuits and contacts and a method of forming them. More particularly, the subject of the invention relates to conductive coating compositions.

Conductive coatings are well-known in the art which are also known as conductive inks. Conductive inks have many favorable characteristics, in that the compositions may include metals such as silver, copper, lead or tin to provide electrical conductivity. The conductive inks also may include adhesives such as polymeric binders which provide for solderability and adhesive strength. Conductive inks have been used for many applications, including applying conductive traces to printed circuit boards. The prior art shows the application of conductive ink by silk screen printing onto a non-moldable insulating baseboard substances, such as FR4 or glass epoxy. The use of conductive inks to make printed circuit boards is an additive process which is much quicker, more easily performed and less expensive than the old subtractive process of covering FR4 completely in copper and then removing the copper except for the areas in which the traces are to remain. Such process is usually accomplished out-of-house by special manufacturers. The present invention using an additive process may be performed in-house by circuit manufacturers at great time and expense savings.

New plastics are known in the art which have characteristics, including high mechanical strength, durability, toughness, chemical resistance and high temperature performance. Liquid crystal polymers (LCPs) offer these characteristics, while providing the advantage of all moldable plastics. LCPs are able to withstand temperatures as high as 520° fahrenheit before disintegrating. It is an object of the present invention to combine the high temperature and moldable properties of plastics such as LCP with the quick and convenient process of printing with conductive inks.

SUMMARY OF THE INVENTION

The invention provides a moldable high temperature plastic substrate adhered with a conductive coating, providing conductive components. Any substantially non-conductive moldable high temperature polymer material is contemplated by the present invention. The conductive coating may be applied by printing, screen printing, silk screening, spraying, dipping, vacuum plating, process engraving, pad printing, or by ink jet. Conductive components which are contemplated by the present invention include electrical connectors being formed of moldable polymers and having the contact surfaces covered with conductive coatings. Also, encompassed by the present invention are moldable printed circuit boards of LCP having traces of conductive ink printed thereon. The present invention overcomes the former problems of manufacturing electrical connectors with respect to expensive tooling and machining costs. Typical electrical connectors require that the contact areas be made of stamped and formed metals which are then inserted or loaded onto an insulator body. By forming the contacts integrally with the insulator body, the manufacturing process is much quicker and less expensive. The new plastics, such as LCP allow for the molding of miniature contact surfaces which will retain their strength and resiliency upon connection with a corresponding male or female connector. LCP also has high temperature characteristics which allow high temperature curing of conductive inks when adhered to the LCP to form traces on printed circuit boards, or contact surfaces on connectors.

A principal object of this invention is to provide conductive components which are easily and inexpensively manufactured.

It is another object of this invention to provide electrical connectors which may be molded to any shape or size and have conductive surfaces easily adhered thereon.

It is a further object of this invention to provide molded printed circuit boards having traces of conductive ink printed thereon.

It is another object of this invention to provide a method for adhering conductive traces to a substrate.

It is a further object of the present invention to provide dual function contacts.

These and other features of the invention are set forth below in the following detailed description of the presently preferred embodiments.

DETAILED DESCRIPTION OF THE PRESENTLY PREFERRED EMBODIMENTS

The present invention relates to an improved printed plastic circuit and contacts. The invention can be better understood by reference to FIGS. 1–14, which show various aspects of presently preferred embodiments of this invention.

Figure 1:
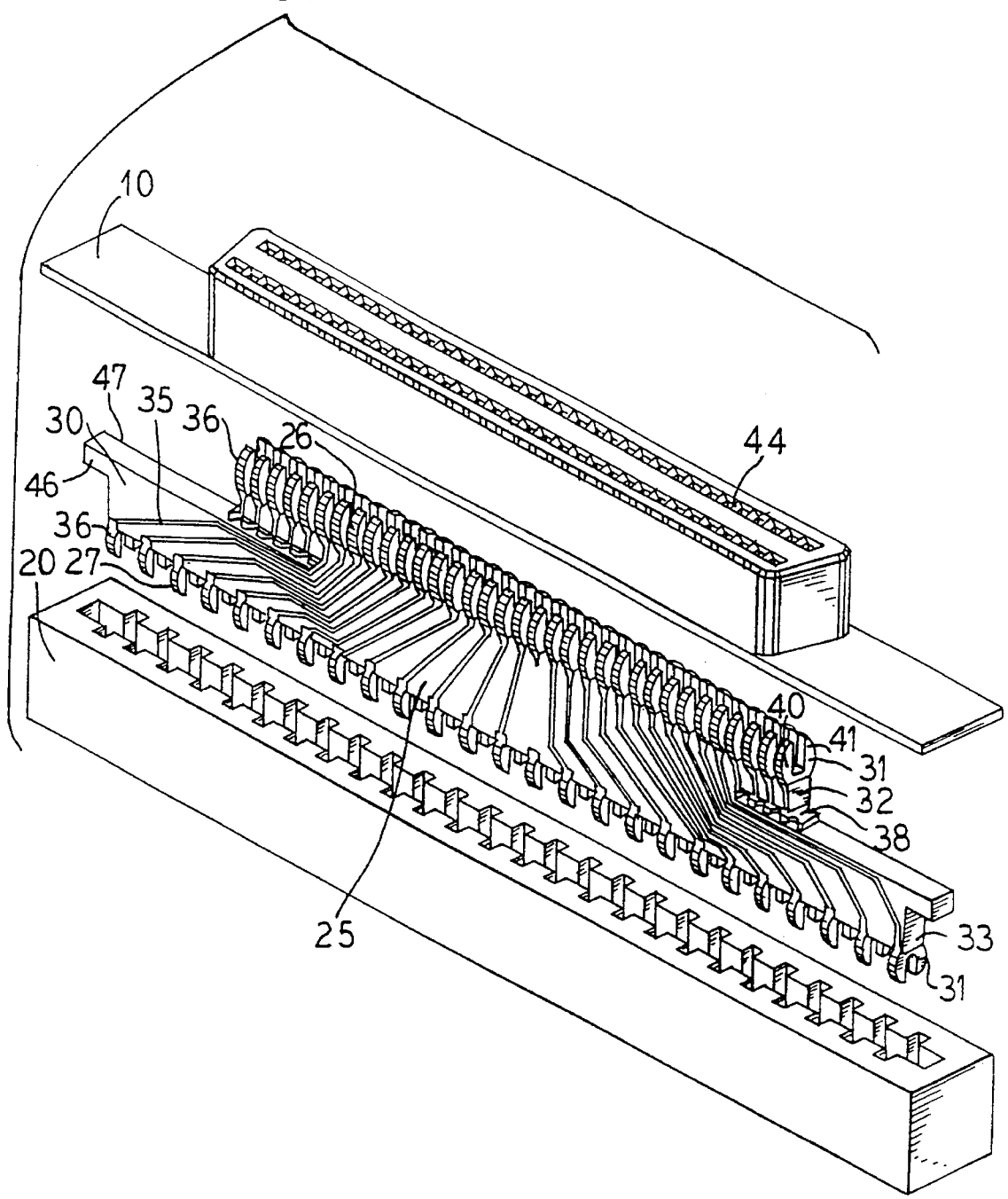
FIG. 1 is a is a perspective view of a new and improved female by female electrical connector circuit.

Turning to FIG. 1, an electrical connector circuit is shown having a top connector side 10, a bottom connector side 20 and a molded circuit 30. The molded circuit 30 uses the method of the present invention to provide a female-by-female convertor. The top connector side 10 is a high density 68-position connector. The bottom connector side 20 is a low density 50-position connector. The molded circuit 30 acts as a convertor between the 68-position top connector side 10 and the 50-position bottom connector side 20. The molded circuit 30 includes a circuitized area 25 in which electrical traces 35 are adhered. In an alternative embodiment the circuitized area 25 could also contain active or passive devices adhered thereto, such as resistors or integrated circuits. The molded circuit also includes terminal points 26,27 at the end of the traces which expose the traces so that the electrical signals can be carried to or from an external source such as a male connector contact in the case of this particular embodiment. The molding shape of the circuit 30 provides for, the terminal points 26,27 of this embodiment to be coincident with the contacts 31. Contacts 31 are integrally molded with the molded circuit 30. The contacts 31 are adjacently molded to form a top comb of contacts 32 and a bottom comb of contacts 33. The molded circuit 30 includes traces 35 of printed conductive solderable ink.

By using the conductive ink to print traces, a new connector may be easily designed simply by changing the drawing and imaging of the trace design and re-screening on the same molded circuit, instead of having to re-mold the entire circuit. Conductive ink may be adhered to the substrate using the methods shown in the examples below. Any conductive ink may be used which is of suitable viscosity to enable the conductive ink to be adhered to the substrate via screen printing, brush, roller, spraying, dipping, masking, vacuum plating, vacuum deposition or any combination of the foregoing and then cured by heat oven, vapor phase oven or IR light to form a continuous electrical pathway. The conductive inks which are anticipated by this invention include copper or silver based compositions having silver oxide or tin and lead alloy binding compositions. Other conductive ink compositions which provide solderability and conductivity are also included in the present invention.

The electrical connector circuit is assembled by inserting molded circuit 30 into bottom connector side 20 and covering top comb 32 with top connector side 10. The same ink which is printed to form traces 35 also cover the outer surface 36 of contacts 31. The conductive contact surface 36 provides for electrical connection between first male contact members (see FIG. 9) which are inserted into the top contact side 10 and second male contact members which are inserted into bottom contact side 20. A capacitor 38 is inserted within the molded circuit. In an alternative embodiment capacitor 38 could be replaced with a communication bridge to provide contact between traces on both sides of circuit 30.

The molded circuit 30 in the preferred embodiment is molded of a liquid crystal polymer such as a celenise plastic, V-140 (Vectra) which is a characteristic of LCP having great strength while also allowing some resiliency allows for the forming of miniature contacts 31. The contacts at the low density side, bottom comb 32 may be molded on 0.100 inch. centers and at the high density side, top comb 32 on 0.050 inch centers. These contacts 31 have two ears 40, 41 which move toward one another upon insertion of a male contact member, frictionally engaging each of the side surfaces 36 of ears 40,41 to provide retention of the male contact member inserted within passage 44 of the connector housing and also provide a constant electrical connection.

The conductive ink is cured at high temperatures onto the molded circuit 30 in order to adhere the conductive ink to the LCP to form traces 35 and contact surfaces 36. Such a process assures multiple cycles of insertion of connectors without disturbing the adherence of the conductive ink to the contact 31. As well, other techniques may be used to assure that the conductive ink is properly adhered, as well as to insure that there is sufficient conductivity between the female contacts 31 and the male contacts. Such conductivity may be improved by plating contacts 31. Such plating may be added to the conductive ink 36 using metals such as nickel-silver, gold, copper/nickel/gold, or tin-lead. Also, processes such as electroless or electrolytic may be used.

This circuit 30 may also include dual wipe contacts with conductive ink 36 adhered to both sides of the circuit 30 so that ear 40 has conductive ink and ear 41 also has conductive ink adhered to its outer surface. The contact 30 has the unique ability to provide two functions or two separate signals on each side of the contact 40, 41. For example, ear 40 may provide a signal path to a ground and ear 41 may provide a signal path through a resistor to power.

Figure 2:
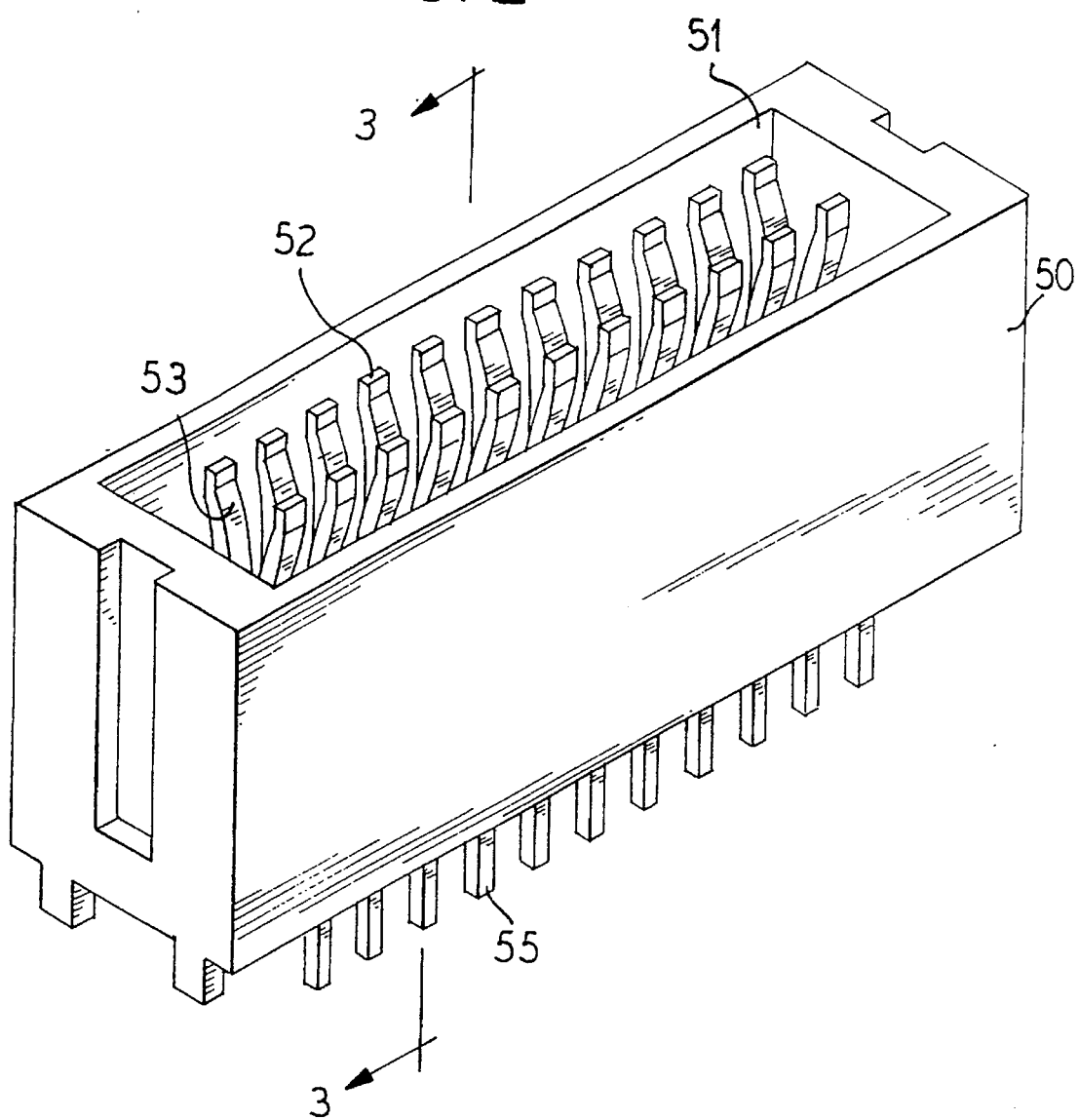
FIG. 2 is a perspective view of an electrical connector incorporating another component.

Turning to FIG. 2, another embodiment of the invention is shown. An electrical connector having a housing 50 having a top opening 51 and therein contacts 52. The contacts are arranged along the length of the housing 50 in opposing relationship. The contacts 52 are female contacts which receive male contacts therebetween. The male contact is inserted into the top 51 of the shell 50 and engage inner surfaces 53 of contacts 52. The inner surfaces 53 have a conductive coating adhered thereto (see FIG. 3). The contacts 52 have a contact tail 55 which also has a conductive coating. The contact tail may be mounted on a substrate such as by insertion into a printed circuit board. The contacts 52 are formed of molded plastic material such as LCP. This particular embodiment of the invention shows female contacts incorporating the present invention. However, male contacts of moldable plastic having conductive coatings printed thereon are also contemplated by this invention.

Figure 3:
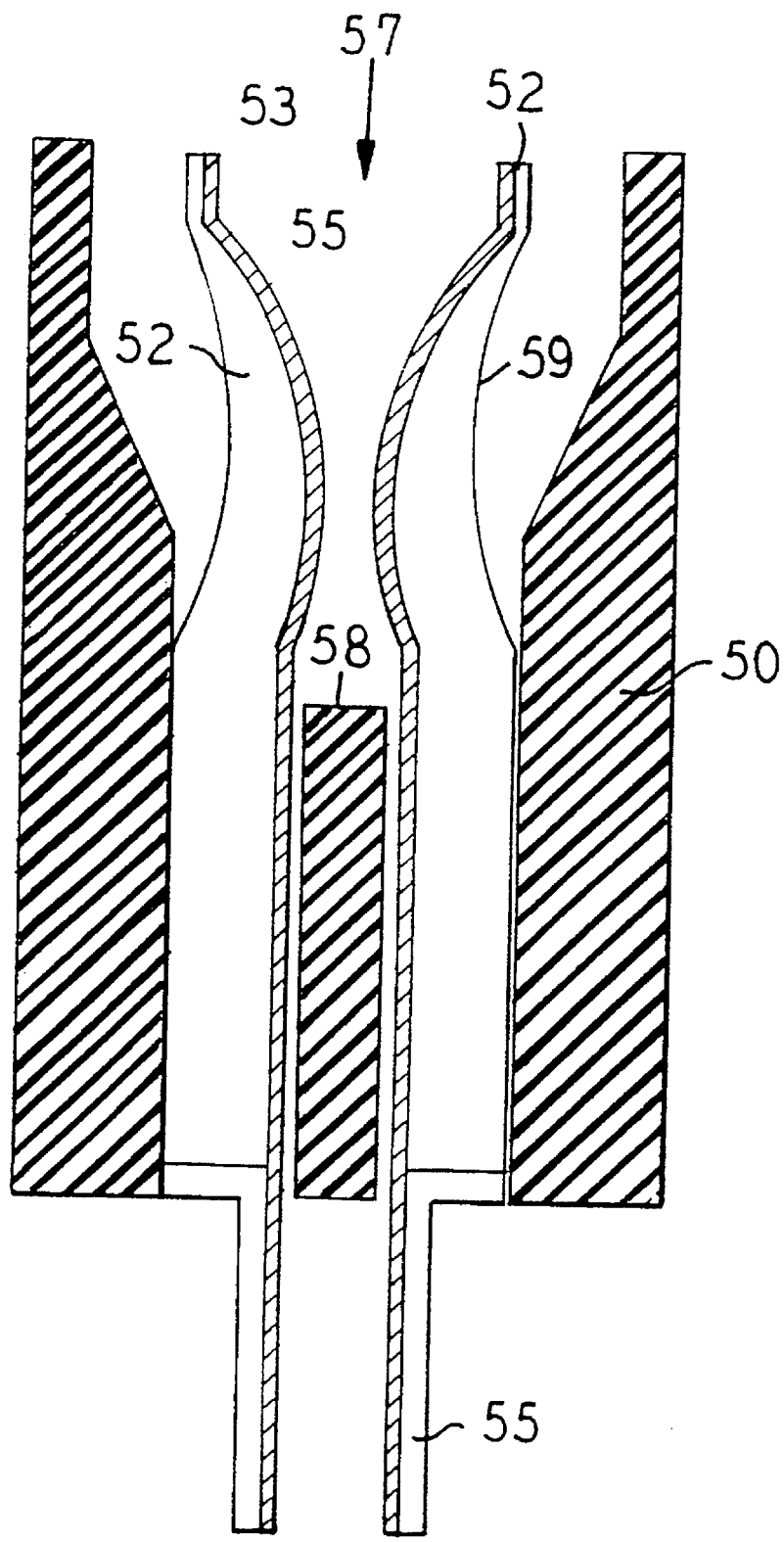
FIG. 3 is a cross-sectional side elevation view of FIG. 2 taken at line 3—3.

FIG. 3 shows a cross-sectional side elevation of FIG. 2 taken at line 3—3. The connector housing 50 and contacts 52 are formed of molded LCP. Contacts 52 have a conductive coating 55 adhered on the inner side 53. In an alternative embodiment, a conductive coating could also be adhered to an outer side of contacts 52. Such a dual-sided contact provides a dual function contact because the two traces of conductive coating are isolated from each other by the insulation of the contact 52. The use of dual function contacts allows for reduction in the number of contacts required for a specific application and the overall size of the connector housing such dual function contacts. For example, in a traditional SCSI (small computer standard interface) I device having traditional metal contacts each which may only carry a single signal, fifty (50) pairs of contacts are required having 0.100 inch spacing to provide a connector of overall length of at least 2.50 inches. Using the plastic molded dual function contacts of an alternative embodiment of the present invention, only twenty-five (25) pairs contacts are required, reducing the overall length of connector to 1.75 inches.

A male contact may be inserted between contacts 52 from direction of arrow 57 to be inserted between contacts 52, 52 until it abuts bottom surface 58. The contacts 52, 52 are molded of a plastic material which provides some resiliency, so that upon insertion of a male member between contacts 52, 52 the upper portions 59 of contacts 52, 52 will spring backwards providing a frictional force between the male contact and the contacts 52, 52 and providing an electrical conductive connection therebetween. Contact tail 55 carries the electrical transmission from the top portion 59 of contacts 52, 52 to be connected to a substrate.

Figure 4:
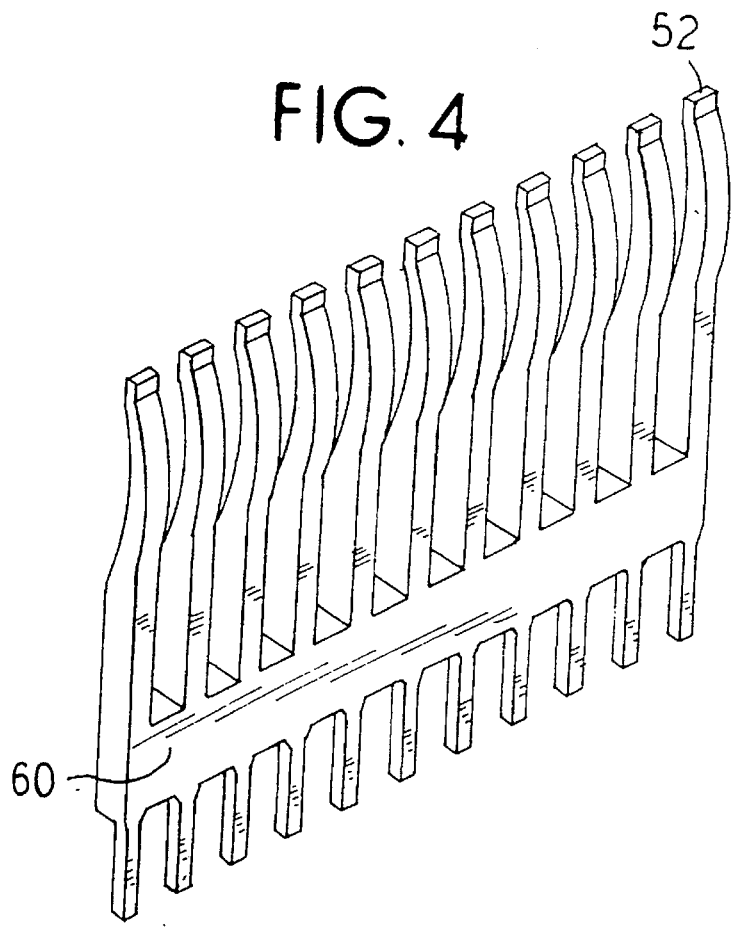
FIG. 4 is a perspective view of the contact elements of the electrical connector of FIG. 2, prior to adhesion of the conductive surface.

FIG. 4 is a perspective view of the contact elements of the electrical connector of FIG. 2. The contacts 52 are gang molded as multiple contacts joined along their base by a bar 60. The nolding of contacts in such an orientation allows for the molding of multiple contacts in one shot and also allows for quick and easy insertion of multiple contacts in a uniform position within a connector housing 50. FIG. 4 shows the contacts prior to adherence of a conductive coating.

Figure 5:
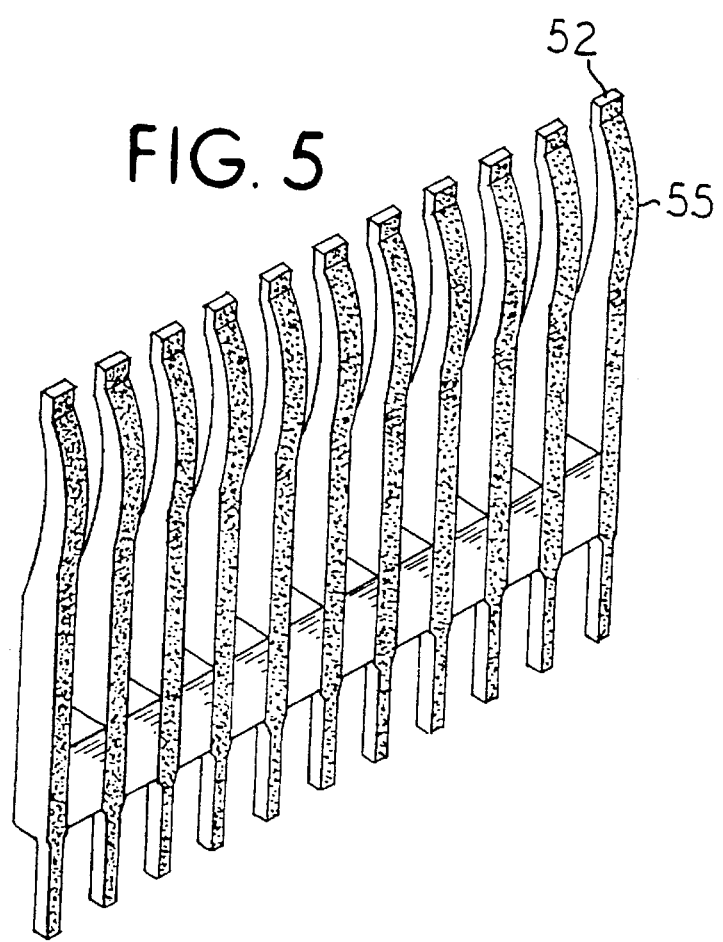
FIG. 5 is a perspective view of the contact elements of the electrical connector of FIG. 2, subsequent to adhesion of the conductive surface.

FIG. 5 shows the same plastic contacts 52 of FIG. 4 having a conductive coating 55 adhered thereto. The adherence of the conductive coating can be accomplished by screen printing, spraying, dipping and masking, vacuum plating, vacuum deposition or by ink jet. Various conductive inks may be adhered according to the examples below to provide strong adherence characteristics so that the contacts 52 may withstand multiple cycles of swiping by male contacts. In an alternative embodiment, the plastic contacts 52 may be plate with metals such as gold or copper/nickel/gold to provide for the conductive coating.

Figure 6:
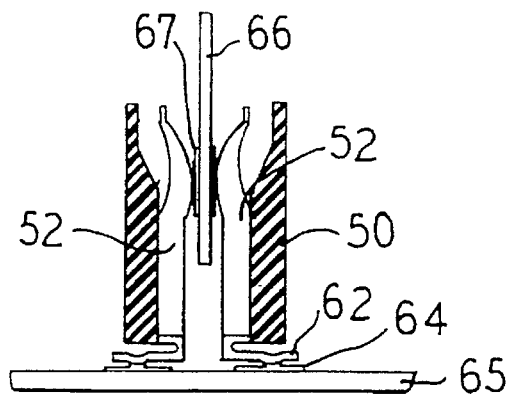
FIG. 6 is a side elevation view partly in section of the electrical connector of FIG. 2, showing an embodiment of the invention having surface mount construction.

The connector shown in FIG. 2 may provide the basis for many variations of connectors having varying mounting configurations such as FIG. 6 which shows contact tails 62 being bent outwardly at right angles under the housing 50 to allow for surface mounting of the connector on a substrate 65. A substrate 65 such as a printed circuit board may have pads 64 which upon activation will bond to the conductive coating of contact tail 62. Male contact 66 having conductive surface 67 is shown inserted in between contacts 52, 52.

Figure 7:
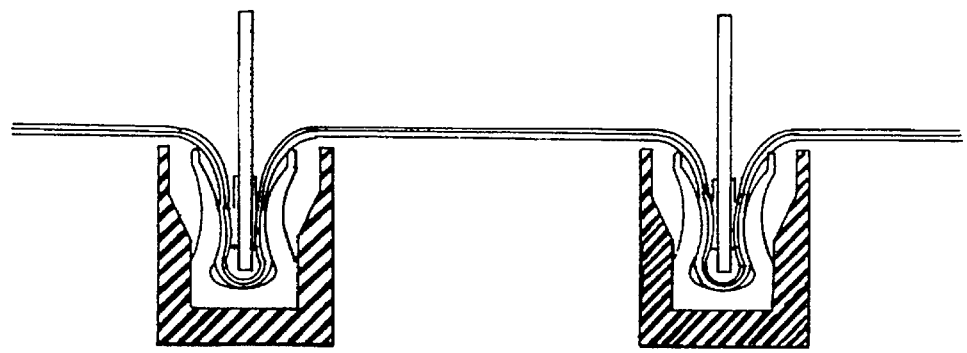
FIG. 7 is a side elevation view of the electrical connector of FIG. 2, partly in section showing a further embodiment as a daisy chain.

Another variation is shown in FIG. 7 showing a daisy chain connection between connectors.

Figure 8:
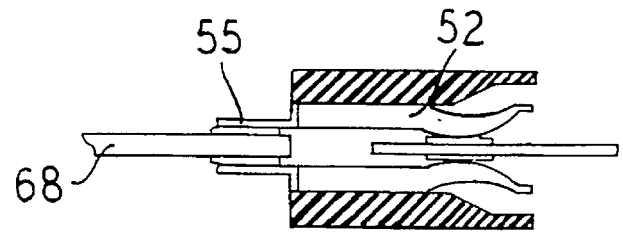
FIG. 8 is a side elevation view partly in section of the electrical connector of FIG. 2 showing an embodiment of the present invention, having an edge card attachment.

FIG. 8 shows a card edge connector wherein contacts 52 have contact mils 55 which are connected to the edge of a printed circuit board 68.

Figure 9:
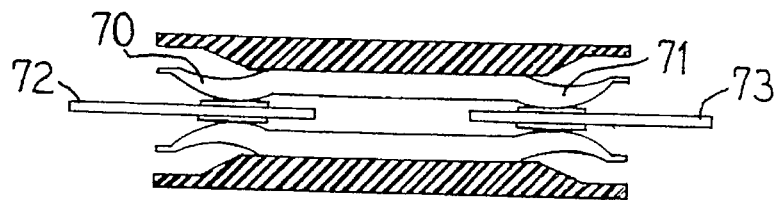
FIG. 9 is a side elevation view partly in section of the electrical connector of FIG. 2 having a double female embodiment of the present invention.

FIG. 9 shows a double female connector having a connector with a first female end 70 and a second female end 71 which accepts a first male connector 72 and a second male connector 73 from the opposite end.

Figure 10:
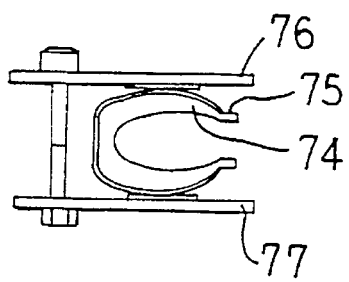
FIG. 10 is a side elevation view of the electrical connector of FIG. 2 having a surface mount—compression embodiment of the present invention.

FIG. 10 shows a surface mount compression connector wherein the plastic contact 74 having a conductive coating 75 is compressed between two substrates 76, 77 providing a surface mount connection.

Figure 11:
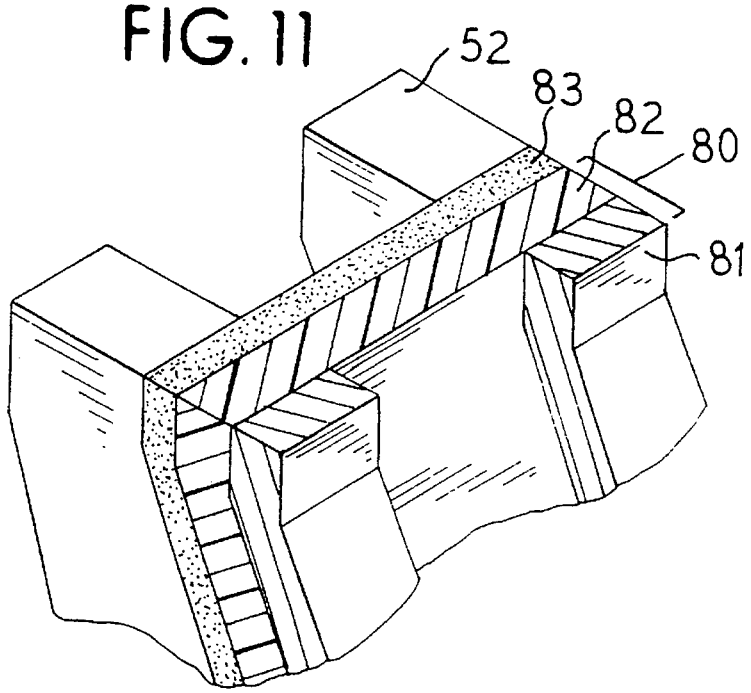
FIG. 11 is a perspective view of an alternative embodiment of the contact members of the electrical connector of FIG. 2.

FIG. 11 shows an alternative embodiment of the present invention wherein the conductive coating of the prior embodiments is replaced by a flexible printed circuit 80 which includes a metal conductor 81 and a film insulator 82. This flexible printed circuit is adhered to the molded plastic connector 52 which has been shown throughout the prior embodiments of this invention. An adhesive 83 is used to adhere the flexible printed circuit 80 to the contacts 52.

Figure 12:
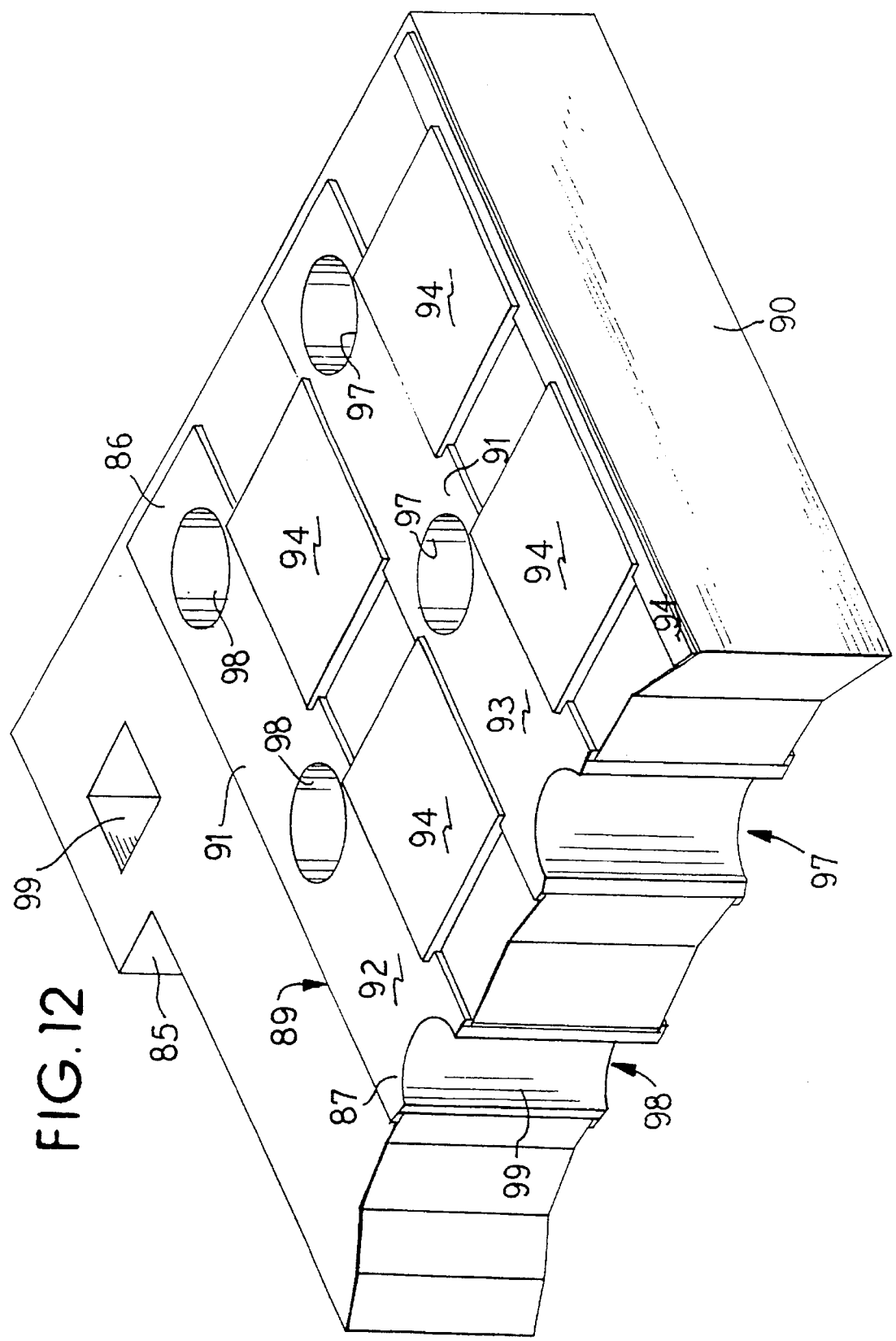
FIG. 12 is an enlarged fragmentary perspective view of a printed circuit board.

FIG. 12 shows a further alternative embodiment of the present invention showing a printed circuit board 90 formed of a plastic such as LCP V-140 (VECTRA). Use of plastic to form a printed circuit board allows the board to be molded into any configuration. As shown, passage 99 and bend 85 are molded into the printed circuit board 90 and allows the board 90 to be inserted into many places and in orientations prohibited in the past by the inflexibility of FR4 boards. FIG. 12 shows an enlarged view of a printed circuit board 90 having circuitized area 89 where conductive ink 91 is adhered to the surface of the printed circuit board 90. Traces 92, 93 and 94 in the preferred embodiment of this invention were adhered to the printed circuit board 90 by screen printing. This is accomplished by passing an inked roller or squeegee over a template having a positive image of the circuit traces to be printed which forces the conductive to be transferred to the substrate. The conductive ink is cured according to the examples below. Cleaning of the conductive ink after curing may also be desired to remove any oxidation layers. Other methods of adhering the conductive coatings are also anticipated by this invention.

Conductive trace 92 includes terminal points 86,87 which provide a point at which the trace 92 is exposed to allow the electrical signal to be transferred to an external source such as a contact point or another printed circuit board. A first terminal 86 and second terminal 87 define a continuous electrical pathway. The conductive ink used in a preferred embodiment of the invention was ORMEF 1200 Croranaga Industries). This conductive ink is a silver-free alloy that is sintered at low temperatures yet achieves high electrical conductivity, good solderability and adhesion strength. The conductive ink melts at 190° C. and once it is hardened, it will not melt again until it reaches more than 320° C. The conductive ink will remain solid at solder temperatures of 180° C. The ink's conductivity is approximately $1.7 \times 10^{-5}$ ohm-cm. The use of ORMET 1200 is especially important to provide such high levels of conductivity. Other conductive inks do not provide such conductivity. However, this invention includes any conductive ink which provides good solderability, conductivity and adhesion to moldable plastics.

Solderability may be increased by increasing surface area of the substrate. In an alternative embodiment of FIG. 12, the surface of printed circuit board 90 has an etch designed into the mold in order to make the surface rough. Other methods such as sandblasting, use of apparatus such as a Sumaca machine, or chemical etching such as applying weak acids may also provide a rougheneel surface to allow for the ink to adhere more easily and increase solderability. Resistors 94,94,94,94 such as thick film resistors, polymer thick film (PTF) resistors or thin film resistors may also be screened onto the printed circuit board adjacent to the traces of conductive ink 92,93,94.

Further, holes 97,97,97 are shown which may be plated through holes which may have pins inserted therein so that contacts may be mounted through the board. In an alternative embodiment, holes 98,98,98 may serve as a via or communication bridge 99 from one side of the board to another. In some applications, a circuit board must be dual-sided so that devices on one side of the board may communicate with devices on the other side of the board. The plastic board may be molded having communication bridges 99 or communication bridges 99 may be drilled in the circuit board. Conductive ink is then adhered to the board and seeps through communication bridge 99 to the other side of the board to traces on the other side providing a communication pathway 99 for the current.

Figure 13:
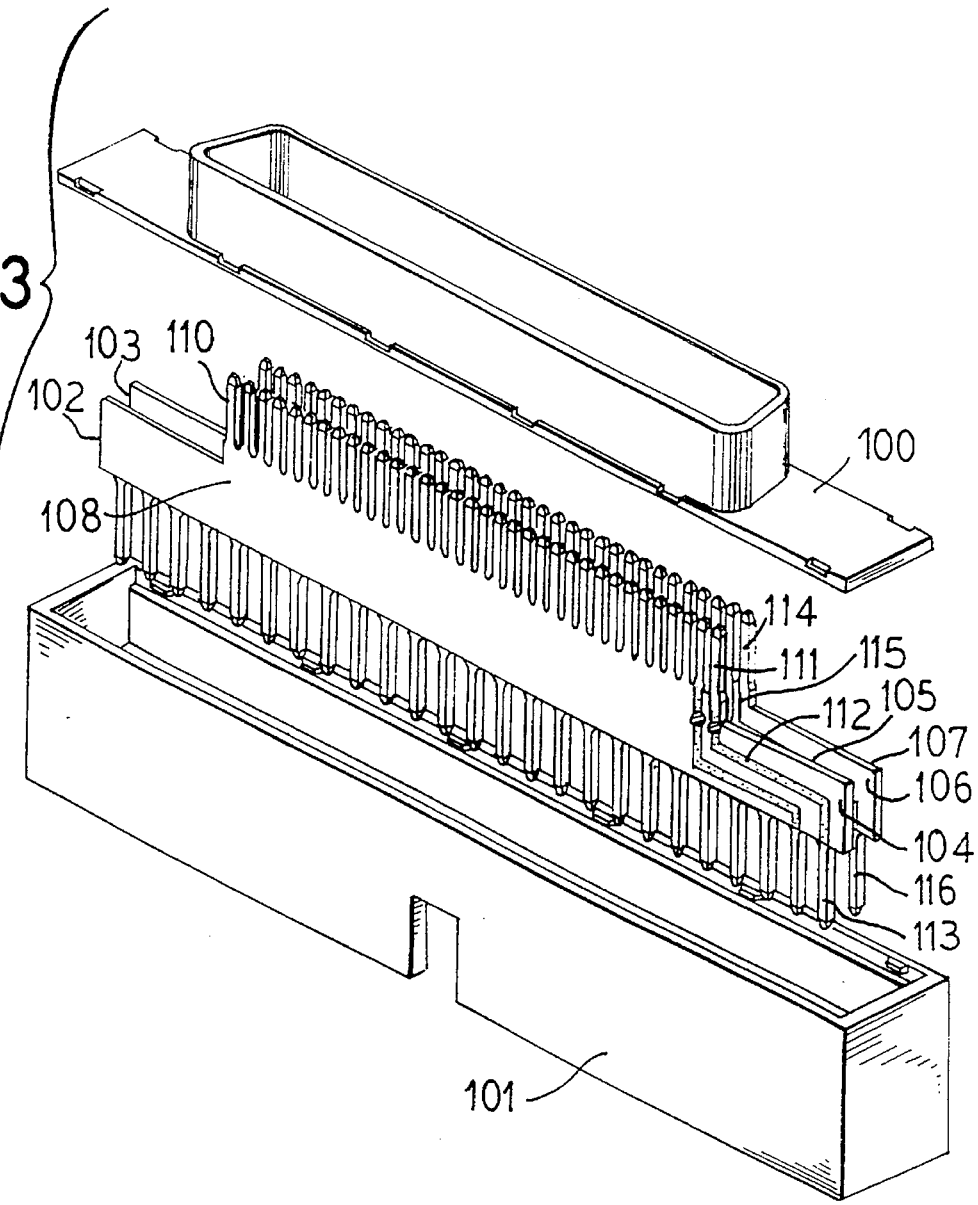
FIG. 13 is an exploded perspective view of a male by male electrical connector.

Such an apparatus and method is necessary for a circuit board but also for the molded contact circuit 30 shown in FIG. 1 and the circuits 102,103 in FIG. 13. The contacts on the first side 46 of the circuit board 30 in some instances must communicate with the second side 47 of the circuit 30 in order that the contacts 31 may communicate between first side 46 and second side 47. Through holes may be drilled at positions along the traces to provide interconnection for each individual trace and the pair of contacts connected to the trace of conductive ink so that it may communicate with the corresponding pair of contacts and trace of conductive ink on the opposite side of the circuit board. Other means of providing communication bridges are also anticipated by the present invention.

FIG. 13 discloses a further alternate embodiment of the present invention showing a male-by-male convertor. The conversion of the 68-position connector side to a 50-position connector side is similar to the embodiment shown in FIG. 1. Two rows of male pins protrude through the top housing 100 and two rows of male pins protrude through the bottom housing 101. A further embodiment of the present invention is shown in this apparatus having plastic molded contacts and a circuit board combined in an integral molded circuit. First molded circuit 102 is arranged parallel to second molded circuit 103 within the housing 101. First molded circuit 102 includes a first side 104 and second side 105. Second molded circuit 103 has a first side 106 and a second side 107. Both molded circuits 102 and 103 include on all sides 104,105 and 106,107 a circuitized area 108 in which electrical traces 112 are adhered. In an alternative embodiment, circuitized area 108 may also include active or passive devices connected within the array of traces. FIG. 13 depicts only two sets of traces; however, the entire circuitized area 108 can have traces printed thereon.

The traces 112 end in terminal points coincident with the contact pins 111,113. First molded circuit 102 includes integrally molded contact pins 110 which have conductive ink adhered to the sides of the pin 110. In some situations only one side of the contact need have conductive ink adhered to. However, some applications require dual swipe contacts having conductive ink adhered to both sides of the contact. In such cases, and as shown in the preferred embodiment in FIG. 13, both the first side 104 and the second side 105 of the first molded circuit 102 will have conductive ink adhered at the contact pin 111 and at traces 112 and contact pins 113. In such an embodiment, the contact pins 111,113 may be dual function by carrying a first signal on trace 112 on first side 104 and a separate second signal on a corresponding trace on the second side 105. Similarly, second molded circuit 103 has conductive ink adhered to first side 106 and second side 107 of the molded circuit 103 at contact pin 114, traces 115 and contact pins 116. This invention also encompasses contact pins having conductive ink adhered to all surfaces.

Figure 14:
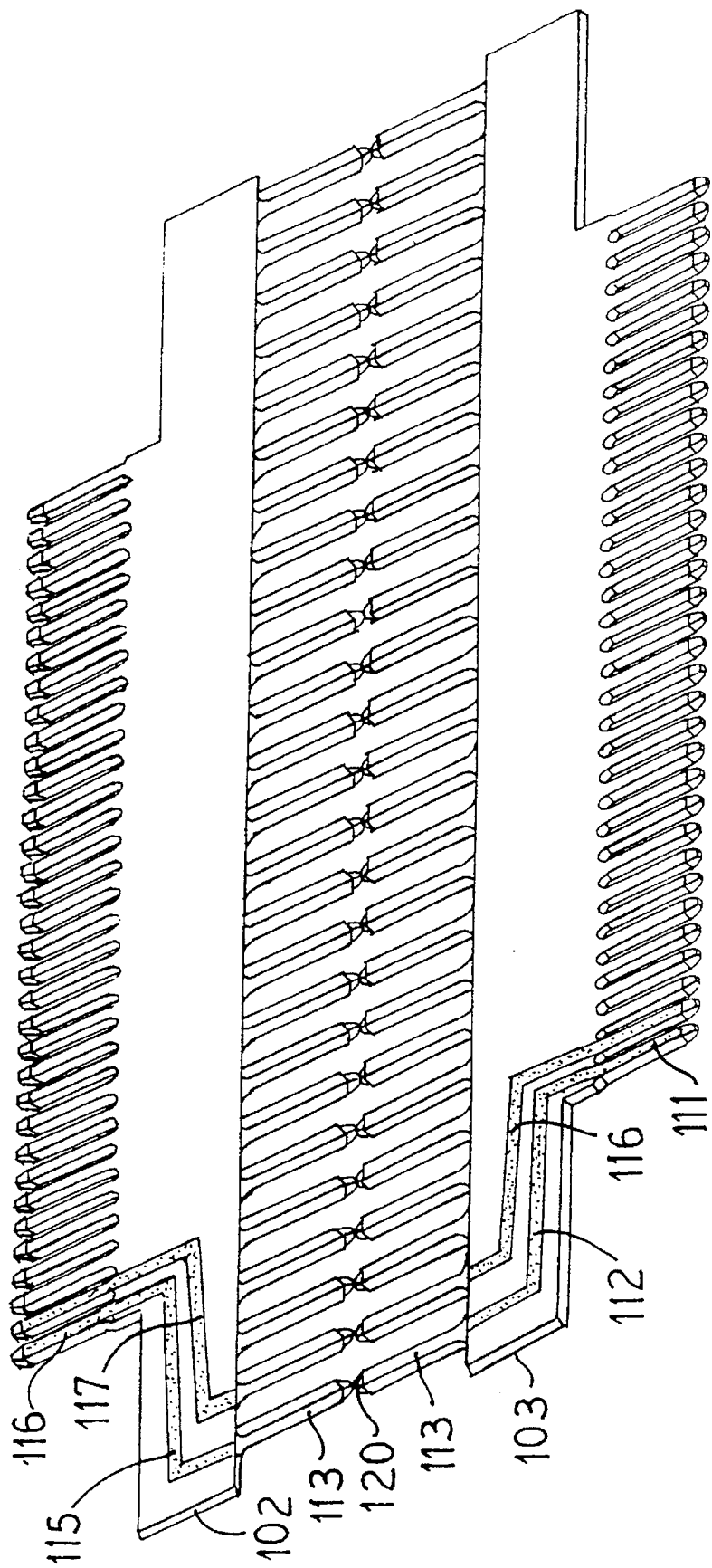
FIG. 14 is a perspective view of the molded circuits of FIG. 13, prior to separation.

The method of applying the conductive ink to the molded circuit is shown in FIG. 14. A method of adhering the conductive ink in a preferred embodiment includes molding the first molded circuit 102 in a one shot process with second molded circuit 103 so that the contact ends meet at a cutting line 120. The conductive traces are adhered to both molded circuits 102 and 103 simultaneously. In a preferred embodiment, the method of adhering the conductive ink to the substrate is via screen printing. As shown in FIG. 14, traces 112 and 117 are all screened on in one step providing conductive ink adhered to the contact pins 113 and 111 as well as all of the traces therebetween. The molded circuit 102 is then separated from molded circuit 103 along pan line 120.

The present invention also anticipates individual plastic contacts and a method of making the same as shown in FIG. 4 and 5. Such individual contacts may be molded of plastic, separate from a substrate and later mounted to the substrate. For example, individual plastic molded contacts could be plated with metal such as gold and press-fit into a substrate such as a printed circuit board 90 of FIG. 12. Alternatively, individual contacts may have a conductive coating adhered thereto and then affixed to a substrate such as a molded circuit 102 of FIG. 13, or as shown in FIGS. 2–9.

Returning to FIG. 13, communication bridge 122 is shown. As discussed above, in certain applications, the conductive traces on the first side 104 of the first molded circuit 102 mast communicate with the conductive traces on the second side 105 of the first molded circuit 102. A hole is drilled in the molded circuit 102 or some other type of communication bridge may be added prior to adherence of the conductive ink. Upon application of the conductive ink to the first side 104 of the molded circuit 102, the conductive ink fills the communication bridge 122 and contacts the conductive ink of the trace on the second side 105 of the circuit.

Further, in some applications, it is necessary that first molded circuit 102 be able to communicate with second molded circuit 103. More specifically, each corresponding pair of contacts 111,114 must be able to communicate, or carry the same current along the traces. In am alternative embodiment, a communication bridge may be placed between the first and second molded circuits 102,103 which will connect the traces of the first molded circuit 102 to the corresponding traces of the second molded circuit 103. This may be accomplished in many methods such as ultrasonic welding of the traces or using soldering techniques. Many other configurations may be used in order to have the two molded circuits in communication and these are all contemplated by the present invention.

Other details concerning the preferred method of adhering and curing the conductive ink of the present invention whether used on the surface of a contact or printed circuit board are provided in the following working examples:

EXAMPLE NO. 1

A conductive ink was adhered to the surface of LCP using the following steps:

1) The conductive ink[1] was screen printed onto LCP.
2) Drying stage: print is dried in a regular box oven with circulating air and exhaust at 80°–85° C. for 25–39 minutes.
3) Reflow stage: the substrate was placed in a vapor-phase oven at 200°–215° C. for 2 minutes.
4) Post-cure stage: the substrate was put in a box oven with circulating air and exhaust at 150°–175° C. for 60 minutes.

[1]ORMET 1200.

This method provides a substrate having conductive coating which is easily prepared and provides for electrical traces having excellent conductivity of approximately $1.7 \times 10^{-5}$ ohm-cm and are very solderable in that the ink adheres to the substrate easily and upon curing provides a strong bond with the substrate and cannot be easily removed or scraped off. Such a prepared substrate can be used for the molded circuits having contacts shown in FIGS. 1–10 and 13–14; or the molded circuit shown in FIG. 12.

EXAMPLE NO. 2

A conductive ink was adhered to the surface of LCP using the following steps:

1) The conductive ink[1] was screen printed onto LCP.

2) Drying stage: print is dried in a regular box oven with circulating air and exhaust at 80°–85° C. for 25–39 minutes.

3) Reflow stage: the substrate was placed in a vapor-phase oven at 200°–215° C. for 2 minutes.

4) Post-cure stage: the substrate was put in a box oven with circulating air and exhaust at 150°–175° C. for 60 minutes.

5) Silver ink was printed over the conductive ink.

6) Polymer thick film resistors were then printed over the traces using the standard stainless-steel screen.

[1] ORMET 1200.

The advantage of this process is that when curing in a vapor phase oven the cure is completed in an inert atmosphere, i.e., no oxygen is present to interfere with the forming of conductive circuitry. The use of silver ink in step six allows for the formation of more stable resistors.

EXAMPLE NO. 3

A conductive ink was adhered to the surface of LCP using the following steps:

1) The conductive ink[1] was screen printed onto LCP.

2) The conductive ink was put through a drying stage by putting it in a box oven with circulating air and exhaust at 80°–85° C. for 25–39 minutes.

3) Reflow stage: the substrate was placed in a vapor-phase oven at 215° C. for 2 minutes.

4) Post-cure stage: the substrate was put in a regular box oven with air and exhaust at 150°–175° C. for 60 minutes.

5) Resistors were then printed over the traces using the standard single-ended screen.

[1] ORMET 1200.

In this example, the use of silver ink for interfacing with the printed resistors is eliminated which gives one less processing step, thus reducing the cost of the process.

EXAMPLE NO. 4

1) Resistors were printed onto the plastic using a stainless steel or polyester screen, or a similar device.

2) Curing of the resistors was completed in a box or conveyorized convection oven.

3) Circuitry was printed using a conductive ink[2], and a standard screen.

4) Curing of the circuitry was completed in a box or conveyorized oven.

5) Solder mask was applied using a standard screen.

6) Solder was reflowed using standard vapor phase or IR equipment.

7) Solder paste was applied on the solder pads, and reflowed in a standard IR reflow oven.

[2] Mitsui #S-5000-3 copper paste.

With the use of a directly solderable copper ink, we are able to achieve a good interface between the circuit and the printed carbon resistors without additional printings and with an ink that requires a simple thermo cure with no inert atmosphere.

EXAMPLE NO. 5

1) Resistors were printed onto the plastic using a stainless steel or polyester screen, or similar device.

2) Curing of the resistors was completed in a standard box or conveyorized convection oven.

3) Circuitry was printed using a conductive ink[3], applied with a stainless-steel or polyester screen, or similar device.

4) Curing of the circuitry was completed in a standard box or conveyorized oven.

5) Solder mask was applied using a standard screen.

6) Solder was reflowed using standard vapor phase or IR equipment.

7) Solderable conductive ink was printed on the solder pads using a standard screen[4].

8) Ink was cured using a standard box oven.

9) Solder paste was applied on the solder pads, and reflowed in a standard IR reflow oven.

[3] Methode Development Co. #1212 conductive silver.
[4] Mitsui #S-5000-3 copper paste.

This option allows the circuitry to be prepared with silver ink. The advantage of the silver ink is its stability in harsh environments, and other specialty properties, such as forming a conductive surface that serves as a wiper contact pad with good long term wear properties necessary for applications such as plastic contacts.

EXAMPLE NO. 6

1) Resistors were printed onto the plastic using a stainless-steel or polyester screen, or similar device.

2) Curing of the resistors was completed in a standard box or conveyorized convection oven.

3) Circuitry was printed using a conductive ink[5] applied by pad printing (transfer printing).

4) Curing of the circuitry was completed in a standard box or conveyorized convection oven.

5) Solderable conductive ink was printed on the solder pads using pad printing[7] (transfer printing).

6) Ink was cured using a standard box oven.

7) Solder paste was applied on the solder pads, and reflowed in a standard IR reflow oven.

[5] Methode Development Co. #1212 conductive silver
[6] Mitsui #S-5000-3 copper paste The unique advantage of this process is its ability to print circuitry on a surface that is three-dimensional. This process would be especially useful for printing conductive ink on the contacts of the electrical connector circuit of FIG. 1. In Examples 1 through 4, all printing must be done on a flat surface.

The description above has been offered for illustrative purposes only, and it is not intended to limit the scope of the invention of this application which is defined in the following claims.

We claim:

1. An electrical connector comprising:
a unitary, molded thermoplastic connector body, said connector body including a base portion and at least one projecting contact arm portion extending from a first end connected to the base portion to a second free end spaced from the base, the contact arm portion having at least one contact surface defined thereon adjacent the free end thereof, the contact surface having an electrically conductive region thereon defined by a firmly-adherent, electrically conductive coating.

2. An electrical connector as defined in claim 1, wherein said connector body is molded from a high temperature resistant moldable thermoplastic composition exhibiting dimensional stability at temperatures above about 200° C.

3. An electrical connector as defined in claim 1, wherein said contact arm portion is a resilient flexible member.

4. An electrical connector as defined in claim 1, wherein said contact surface is curved.

5. An electrical connector as defined in claim 1, wherein said connector body defines a matable male contact member.

6. An electrical connector as defined in claim 1, wherein said connector body defines a matable female contact member.

7. An electrical connector as defined in claim 1, wherein said connector body defines a card receiving connector member.

8. An electrical connector as defined in claim 1, wherein said connector body defines a daisy chain receiving connector member.

9. An electrical connector as defined in claim 1, wherein said connector body defines a circuit board to circuit board connector member.

10. An electrical connector as defined in claim 1, wherein said connector body includes a plurality of contact arm portions and defines a pin header array connector.

11. An electrical connector as defined in claim 1, wherein said connector body includes a plurality of contact arm portions and defines a female pin-receiving array connector.

12. An electrical connector as defined in claim 1, wherein said connector body includes at least one second contact portion spaced from said contact arm contact surface and an electrically conductive pathway electrically connecting the contact arm contact surface and said second contact portion, said pathway being defined by a firmly adherent, electrically conductive coating of a composition including a cured polymer matrix and conductive additive.

13. An electrical connector as defined in claim 12, wherein said second contact portion includes an electrically conductive region thereon defined by a firmly adherent, electrically conductive coating of a composition including a cured polymer matrix and conductive additive.

* * * * *